(12) United States Patent  
Braganca et al.

(10) Patent No.: US 8,432,644 B2  
(45) Date of Patent: Apr. 30, 2013

(54) SPIN TORQUE OSCILLATOR SENSOR ENHANCED BY MAGNETIC ANISOTROPY

(75) Inventors: Patrick M. Braganca, San Jose, CA (US); Bruce A. Gurney, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 258 days.

(21) Appl. No.: 12/884,080

(22) Filed: Sep. 16, 2010

(65) Prior Publication Data

US 2011/0007431 A1    Jan. 13, 2011

Related U.S. Application Data

(63) Continuation-in-part of application No. 12/492,050, filed on Jun. 25, 2009, now Pat. No. 8,259,409.

(51) Int. Cl.  
*G11B 5/39* (2006.01)

(52) U.S. Cl.  
USPC .......................................................... 360/324

(58) Field of Classification Search ....... 360/324–324.2; 257/421; 365/158  
See application file for complete search history.

(56) References Cited

U.S. PATENT DOCUMENTS

| | | |
|---|---|---|
| 4,464,691 A | 8/1984 | Sawazaki et al. |
| 4,593,332 A | 6/1986 | Akiyama et al. |
| 4,609,950 A | 9/1986 | Chiba et al. |
| 4,635,152 A | 1/1987 | Iwasaki et al. |
| 4,677,512 A | 6/1987 | Akiyama et al. |
| 5,695,864 A | 12/1997 | Slonczewski |
| 5,734,267 A | 3/1998 | Senda et al. |
| 6,271,998 B1 | 8/2001 | Coehoorn et al. |
| 6,532,164 B2 * | 3/2003 | Redon et al. .................... 365/97 |
| 6,566,872 B1 | 5/2003 | Sugitani |
| 6,704,178 B2 | 3/2004 | Nakashio et al. |

(Continued)

FOREIGN PATENT DOCUMENTS

| | | |
|---|---|---|
| JP | 61271604 A | 12/1986 |
| JP | 2007142746 A | 6/2007 |
| WO | 2008115291 A2 | 9/2008 |

OTHER PUBLICATIONS

Sankey et al., "Mechanisms limiting the coherence time of spontaneous magnetic oscillations driven by dc spin-polarized currents", © 2005 The American Physical Society, Physical Review B, vol. 72, p. 224427/1-224427/5 F.

(Continued)

*Primary Examiner* — Will J Klimowicz  
(74) *Attorney, Agent, or Firm* — Zilka-Kotab, PC

(57) ABSTRACT

A spin torque oscillator device having a magnetic free layer with a magnetic anisotropy that has a component that is oriented perpendicular to a direction of an applied magnetic field. The spin torque oscillator device includes a magnetic reference layer, a magnetic free layer and a non-magnetic layer sandwiched there-between. A component of the magnetic anisotropy of the free layer can be oriented perpendicular to a magnetization of the reference layer, and this orientation relative to the magnetization of the reference layer can be either in lieu of or in addition to its orientation relative to the applied magnetic field. The magnetic anisotropy cants the magnetization of the free layer which would otherwise be oriented antiparallel with the magnetization of the reference layer. The magnetic anisotropy in the free layer improves performance of the spin torque sensor by reducing noise.

24 Claims, 15 Drawing Sheets

U.S. PATENT DOCUMENTS

| | | | |
|---|---|---|---|
| 7,471,491 B2 * | 12/2008 | Sato et al. | 360/313 |
| 7,616,412 B2 * | 11/2009 | Zhu et al. | 360/324.2 |
| 7,678,475 B2 | 3/2010 | Slavin et al. | |
| 7,791,829 B2 | 9/2010 | Takeo et al. | |
| 7,826,160 B2 * | 11/2010 | Sato et al. | 360/30 |
| 7,957,098 B2 | 6/2011 | Yamada et al. | |
| 8,054,677 B2 * | 11/2011 | Zhu | 365/158 |
| 8,085,582 B2 * | 12/2011 | Nakamura et al. | 365/158 |
| 8,259,409 B2 | 9/2012 | Braganca et al. | |
| 8,264,799 B2 * | 9/2012 | Akiyama et al. | 360/324.1 |
| 2002/0090533 A1 * | 7/2002 | Zhang et al. | 428/692 |
| 2005/0024788 A1 | 2/2005 | Sato et al. | |
| 2006/0039089 A1 | 2/2006 | Sato | |
| 2006/0221507 A1 | 10/2006 | Sato et al. | |
| 2006/0222835 A1 | 10/2006 | Kudo et al. | |
| 2006/0291107 A1 * | 12/2006 | Sbiaa et al. | 360/324.12 |
| 2007/0019338 A1 * | 1/2007 | Childress et al. | 360/324.1 |
| 2007/0109147 A1 | 5/2007 | Fukuzawa et al. | |
| 2007/0259209 A1 | 11/2007 | Slavin et al. | |
| 2008/0055791 A1 * | 3/2008 | Katada et al. | 360/324.1 |
| 2008/0074806 A1 | 3/2008 | Sato et al. | |
| 2008/0080100 A1 | 4/2008 | Sato et al. | |
| 2008/0112094 A1 | 5/2008 | Kent et al. | |
| 2008/0144232 A1 | 6/2008 | Kaka et al. | |
| 2008/0150640 A1 | 6/2008 | Dimitrov et al. | |
| 2008/0241597 A1 | 10/2008 | Dieny et al. | |
| 2009/0002898 A1 * | 1/2009 | Childress et al. | 360/324.1 |
| 2009/0015250 A1 | 1/2009 | Sunier et al. | |
| 2009/0097167 A1 * | 4/2009 | Sato et al. | 360/324 |
| 2009/0201614 A1 | 8/2009 | Kudo et al. | |
| 2009/0244788 A1 * | 10/2009 | Sato | 360/324 |
| 2009/0244792 A1 * | 10/2009 | Nakayama et al. | 360/324.11 |
| 2010/0109111 A1 * | 5/2010 | Shin et al. | 257/421 |
| 2012/0025339 A1 * | 2/2012 | Zhu | 257/421 |

OTHER PUBLICATIONS

Braganca et al., "Nanoscale magnetic field detection using a spin torque oscillator" © 2010 IOP Publishing Ltd. Nanotechnology, vol. 21, p. 1-6.

Non-Final Office Action Summary from U.S. Appl. No. 12/492,050 dated Mar. 7, 2012.

Notice of Allowance and Fee(s) Due from U.S. Appl. No. 12/492,050 dated Jun. 19, 2012.

* cited by examiner

SPIN TORQUE OSCILLATOR SENSOR ENHANCED BY MAGNETIC ANISOTROPY

RELATED APPLICATIONS

This application is a Continuation In Part application of commonly assigned U.S. patent application Ser. No. 12/492,050 entitled Spin Torque Oscillator Sensor which was filed on Jun. 25, 2009.

FIELD OF THE INVENTION

The present invention relates to magnetic heads for data recording, and more particularly to a sensor that uses spin torque induced magnetic oscillation variation to detect a magnetic field. It also relates to other applications of spin torque oscillators where narrow spectral line widths are desirable, such as microwave sources, mixers and radar.

BACKGROUND OF THE INVENTION

The heart of a computer's long term memory is an assembly that is referred to as a magnetic hard disk drive. The magnetic hard disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head has traditionally included a coil that passes through a magnetic yoke that includes a write pole and a return pole. Current conducted to the coil layer induces a magnetic flux in the pole pieces which causes a write field to emit from the write pole for the purpose of writing a magnetic transition in tracks on the moving media, such as in circular tracks on the rotating disk.

Traditionally a sensor such as a GMR or TMR sensor has been employed for sensing magnetic fields from the rotating magnetic disk. Such sensors use a spin valve magnetic design, including a nonmagnetic conductive spacer layer, or nonmagnetic insulating barrier layer, sandwiched between first and second ferromagnetic layers, referred to as a pinned or reference layer and a free layer. First and second leads are connected to the sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, conduction or tunneling of electrons through the stack of layers is maximized and when the magnetizations of the pinned and free layer are antiparallel, overall conductivity is reduced. Changes in conduction or tunneling alter the resistance of the spin valve sensor substantially in proportion to $\cos\theta$, where $\theta$ is the angle between the magnetizations of the pinned and free layers. When reading stored information, the resistance of the sensor changes approximately proportional to the magnitudes of the magnetic fields from the rotating disk. When a sense current flows through the spin valve sensor, resistance changes cause potential changes that are detected and processed as playback signals.

In order to increase data density, manufacturers always strive to decrease the size of magnetoresistive sensors. For example, decreasing the track width of the sensor to fit more data tracks on the disk and decreasing the gap thickness of the sensor to increase linear data density. However, as spin valve sensors become ever smaller they reach a point where sensor instability and noise make the sensors impractical to achieve sufficiently high signal to noise over the required bandwidth for recording. For example, magnetic noise, resulting from the fluctuations of the ferromagnetic layers caused by temperature, can decrease the signal to noise ratio of a very small sensor to the point that such as sensor cannot effectively be used to read a signal with sufficient certainty. In magnetic tunnel junction sensors, an additional noise resulting from shot noise further increases the noise, thereby decreasing the overall signal to noise and making MTJ sensors unsuitable for ultra high density recording. Therefore, there is a continuing need for a sensor design that can be made very small for reading at very high data densities.

SUMMARY OF THE INVENTION

The present invention provides a spin torque oscillation magnetoresistive sensor for measuring a magnetic field. The sensor uses a change in precessional oscillation frequency of a magnetization of a magnetic free layer to detect the presence of a magnetic field. The magnetic free layer has a magnetic anisotropy that is oriented perpendicular to the biasing direction of the magnetic free layer.

In addition, or in lieu of, being perpendicular to the direction of an applied magnetic field, the magnetic anisotropy can have a component that is oriented perpendicular to a direction of magnetization of a magnetic reference layer that is separated from the magnetic free layer by a non-magnetic layer.

The sensor can include a magnetic free layer, a magnetic pinned layer and a non-magnetic layer sandwiched therebetween. Circuitry is connected with these layers to induce an electrical current through the layers. Electrons that become spin polarized by traveling through one ferromagnetic layer and then pass into a second ferromagnetic layer can induce a spin torque acting upon the second ferromagnetic layer that can drive that layer's magnetization into a persistent precessional state. The oscillation of one ferromagnetic layer with respect to the other causes time-varying resistance changes through magnetoresistance mechanisms such as giant magnetoresistance (GMR), tunneling magnetoresistance (TMR), current perpendicular to the plane GMR (CPP-GMR) or anisotropic magnetoresistance (AMR). As the frequency of these oscillations modulate in response to a magnetic field, this modulation of the oscillation frequency can be measured to detect the presence of the magnetic field.

The magnetic anisotropy of the free layer improves sensor performance by reducing magnetic noise in the signal. More particularly, the magnetic anisotropy reduces phase noise in the signal.

Free layer can have its magnetization biased in a direction that is substantially perpendicular to the air bearing surface. The pinned layer structure can have its magnetization pinned in a direction that is substantially parallel with the free layer and which is substantially perpendicular to the direction of free layer biasing. This orientation, which is rotated 90 degrees from that of a GMR or TMR sensor, improves magnetic sensitivity of the sensor.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
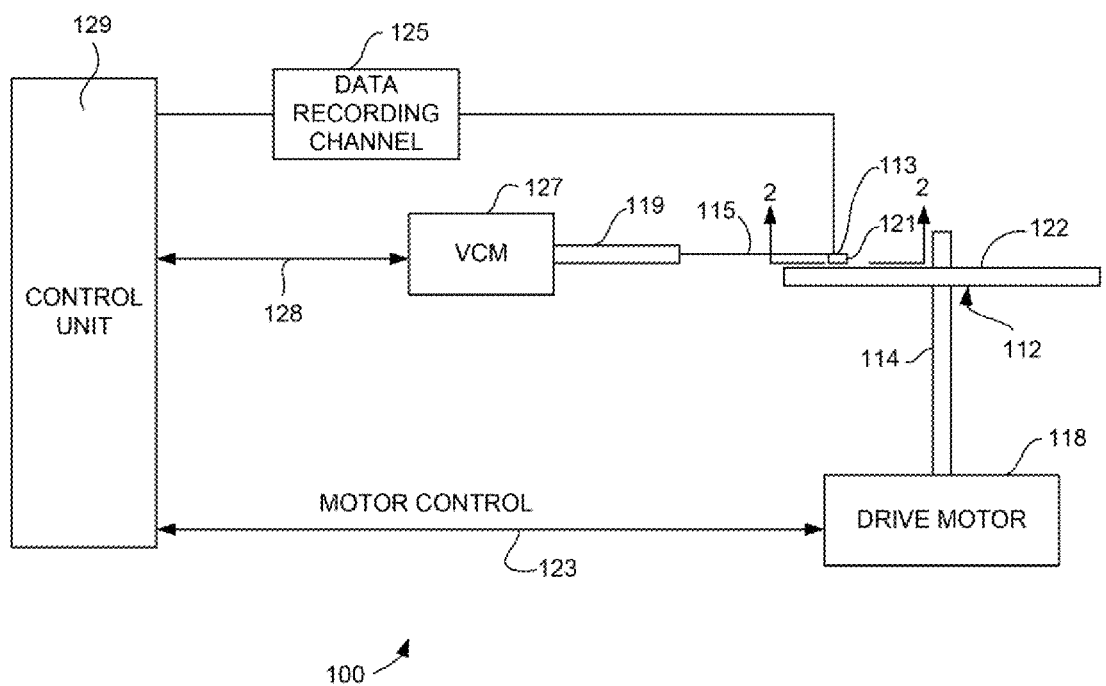
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts a force on the slider. The air bearing thus counter-balances the slight spring force of suspension 115 and supports the slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
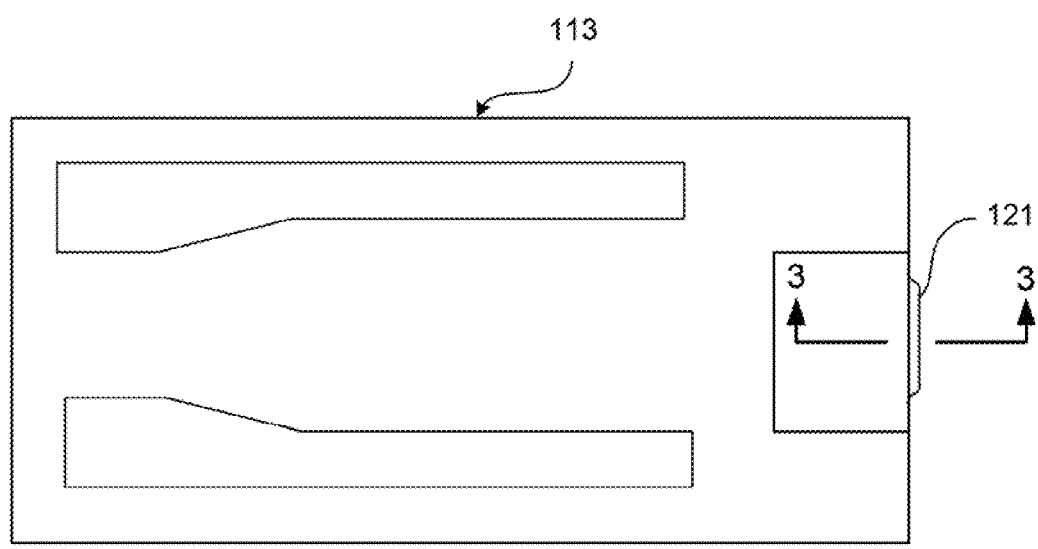
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1, are for representation purposes only. It should be apparent that disk storage systems may contain a large number of disks and actuators, and each actuator may support a number of sliders.

Figure 3:
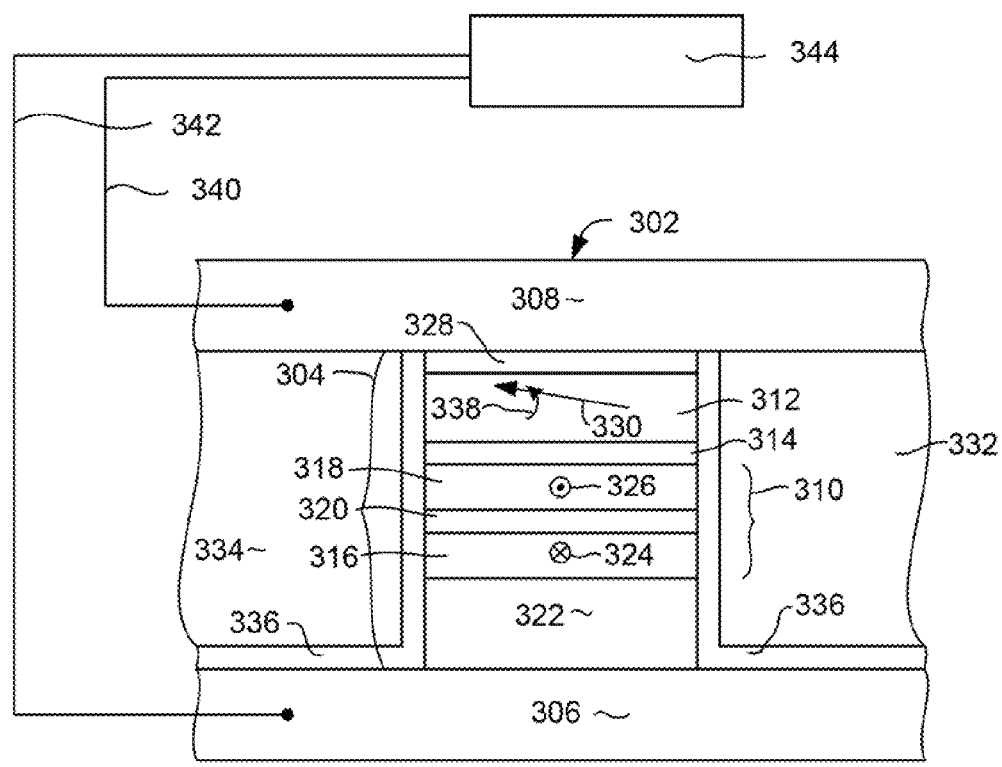
FIG. 3 is a schematic ABS view of a sensor according to an embodiment of the invention.
Figure 4:
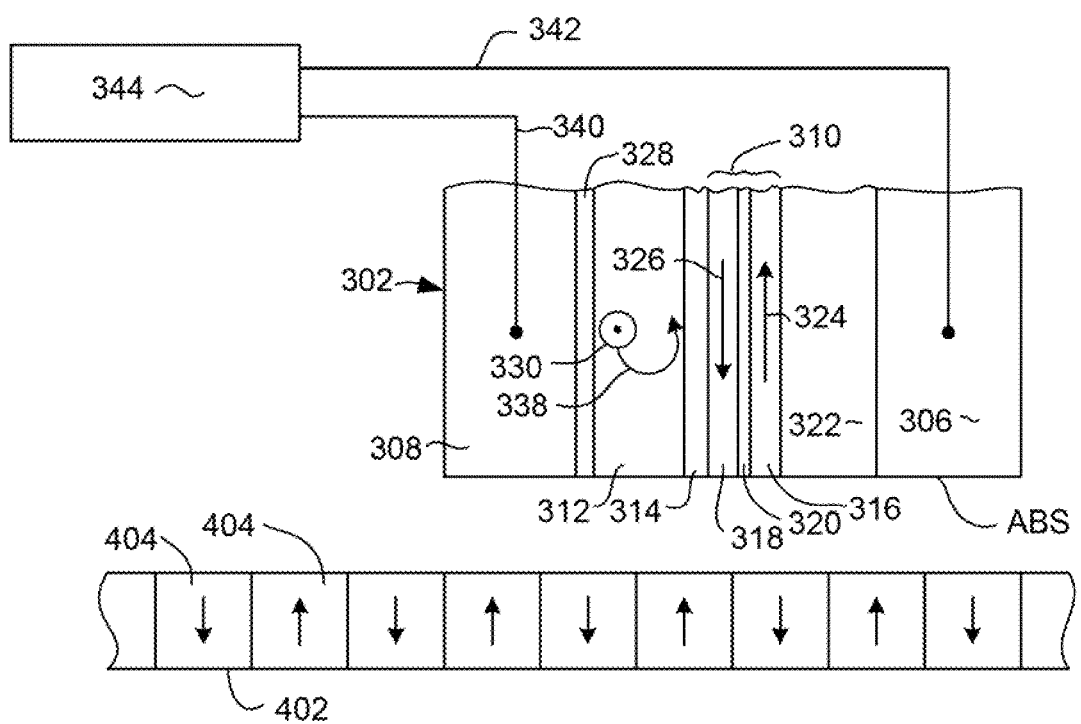
FIG. 4 is a schematic side cross sectional view of the sensor of FIG. 3.

With reference now to FIGS. 3 and 4 a magnetoresistive sensor 302 is shown that can take advantage of spin torque oscillations to sense a localized magnetic field. FIG. 3 shows the sensor 302 as viewed from the air bearing surface (ABS). FIG. 4 shows a side cross sectional view of the sensor 302 and also shows a magnetic medium 402 with recorded magnetic transitions of "bits" 404.

The magnetoresistive sensor includes a sensor stack 304 that is sandwiched between first and second magnetic shields 306, 308 that can be made of an electrically conductive, magnetic material such as NiFe so that they can function as electrical leads as well as magnetic shields. The sensor stack includes a pinned layer structure 310, a free layer 312 and a non-magnetic layer 314 sandwiched between the free layer 312 and the pinned layer structure 310. The non-magnetic layer 314 can be a non-magnetic, electrically conducting spacer layer such as Cu or could be a thin, non-magnetic, electrically insulating barrier layer. A capping layer 328 such as Ta can be formed over the top of the sensor stack 304.

The pinned layer structure can include a magnetic pinned layer 316, a reference layer 318 and a non-magnetic antiparallel coupling layer 320 sandwiched between the pinned layer 316 and the reference layer 318. The pinned and reference layers 316, 318 can be constructed of a material such as CoFe and the antiparallel coupling layer 320 can be constructed of a material such as Ru having a thickness of about 10 Angstroms. The pinned magnetic layer 316 can be exchange coupled with a layer of antiferromagnetic material AFM layer 322, which can be a material such as IrMn, PtMn or some other suitable antiferromagnetic material. Exchange coupling between the AFM layer 322 and the pinned layer 316 strongly pins the magnetization of the pinned layer in a first direction perpendicular to the ABS as indicated by arrow tail symbol 324. Strong antiparallel coupling between the pinned and reference layers 316, 318 pins the magnetization of the reference layer in a second (antiparallel) direction that is perpendicular with the ABS as indicated arrow head symbol 326.

The free layer 312 has a magnetization that is biased generally parallel with the ABS as indicated by arrow 330. Biasing can be provided by first and second hard magnetic bias layers 332, 334 that can be arranged at either side of the sensor stack 304. The bias layers 332, 334 are separated from the sensor stack 304 and from at least one of the leads 306 by insulation layers 336.

When a high current density of spin-polarized electrons generated by one magnetized layer impinges upon a second magnetized layer, spin torque effects are observed which dynamically excite the second layer's magnetization through a mechanism called spin transfer. Here, electrons traveling through the ferromagnet tend to have their spin aligned parallel to the magnetization of the ferromagnet, losing any component of spin angular momentum transverse to the magnetization. To conserve angular momentum, the polarized current must then exert a torque upon the magnetization. For example, in the case shown in FIGS. 3 and 4 with electrons flowing from the reference layer 318 through the non-magnetic layer 314 to the free layer 312, the spin of the electrons flowing through the reference layer 318 are polarized by the magnetization 326 of the reference layer 318. These polarized electrons can then apply a torque to the free layer magnetization 312, generating spin waves that result in chaotic magnetization dynamics (noise) or collective excitations (oscillations), depending on various parameters of the system such as sensor shape, anisotropy, layer materials and thicknesses, and applied currents and magnetic fields.

Spin torque induced noise is undesirable in sensors, and efforts have been made to reduce or eliminate it. In contrast, spin torque oscillations have been considered as possible sources of microwaves for communication applications as discussed by J. C. Slonczewski, JMMM 159, L1 1996. These oscillations involve spin torque excited precession of the magnetization along the equilibrium axis of the ferromagnet. For example, with reference to FIGS. 3 and 4, the precession, or oscillation of the magnetization 330 is indicated by arrow 338. Note that although the pinned layer magnetization is constrained by exchange anisotropy to an antiferromagnetic layer, it is possible for the magnetization of the pinned layer to also oscillate and contribute to the sensor signal when the applied current densities are high enough to generate spin torque excitations in the pinned layer.

It has been found that the frequency of this precession (oscillation frequency) shifts with the application of a magnetic field (S. I. Kiselev et al., Nature 425, 380 (2003), W. H. Rippard et al., PRL 92 027201 (2004)). For the proper choice of sensor materials and geometry, this shift can be very large. Frequency shifts up to 180 GHz/T have been demonstrated and higher values are possible (N. Stutzke, et al APL 82, 91 (2003)) (O. Boulle et al., Nature Phys. 3, 492 (2007)). The present invention takes advantage of these frequency shifts to detect the change in magnetic field at the free layer 338 induced by the magnetic bits of a magnetic recording medium.

With this in mind, the sensor 302 is connected via leads 340, 342 to processing circuitry 344. The leads 340, 342 can be connected with the shield/lead layers 306, 308, such that one lead 340 is connected with one lead/shield layer 308, while the other lead 342 is connected with the other lead/shield layer 306. The processing circuitry 344 sends a sense current through the sensor stack 304, and also measures the electrical resistance across the sensor stack 304. As those skilled in the art will appreciate, the electrical resistance across the spacer or barrier layer 314 changes as the orientation of magnetization 330 of the free layer changes 312 relative to the magnetization 326 of the reference layer 316. The closer these magnetizations 330, 326 are to being parallel the lower the electrical resistance will be. Conversely, the closer these magnetizations 330, 326 are to being anti-parallel the higher the electrical resistance will be.

With reference to FIG. 4, the magnetic transitions 404 of the magnetic medium 402 cause the above described change in the frequency of the oscillation 338 of the magnetization 330. As the magnetization 330 oscillates, the frequency of this oscillation can be measured by the circuitry 344 by measuring the change of electrical resistance across the sensor stack 304. Therefore, the spin torque oscillation that was previously a major contributor to signal noise and a limiting factor in the reduction of sensor size for a standard GMR or TMR sensor is now advantageously utilized to measure the presence of a magnetic field at extremely small bit sizes.

For a spin torque oscillation 338 having a natural frequency of 20 GHz changing by 200 GHz/T, a 50 mT swing in field from the transition 404 in the magnetic medium 402 would result in an oscillation 338 frequency shift of 10 GHz, from 15 GHz to 25 GHz. At a data rate of 1 Gbit per second the spin torque oscillator would precess approximately 15 times over as the sensor passes over a recorded bit of one polarity and 25 times as the sensor passes over a recorded bit of the opposite polarity.

The signal and signal to noise ratio for the spin torque oscillator 302 can be compared to a similar sensor operated as in conventional GMR mode. It can be assumed that the amount of Additive White Gaussian Noise (AWGN) and peak to peak signal amplitude can stay the same. One can expect a 6 dB signal to noise ratio advantage purely from the greater efficiency of the spin torque oscillator 302 as compared with a conventional GMR sensor.

In the preferred embodiment of the STO sensor, as the applied flux is swept from most negative to most positive, the spin torque oscillator is swept across a range of frequencies greater than the bandwidth of the flux signal itself. This wideband modulation of the STO by the flux makes the system more robust to perturbations due to Johnson noise and magnetic noise. Provided that the STO is swept across at least a bandwidth of Fb/π, where Fb is the data rate of the system, the net head and electronics noise in the demodulated signal will be smaller than the noise due to the same sources in a conventional GMR sensor of similar design.

As the modulation of the STO increases further, the net head and electronics noise in the demodulated signal decreases. Since frequency modulated systems typically use phase detection systems, there are important practical limitations to how much the STO frequency can be modulated. One important consideration is that as the modulation depth (defined as the ratio of the frequency range to the maximum frequency) is increased, the bandwidth of the signal at the input to the phase detector must be correspondingly increased and thus the SNR at the input to the phase detector decreases. At very low SNR, noise at the input to the phase detector may be sufficient to change the sign of the signal. This sign change is interpreted by the phase detector as a 180 degree phase change and produces a very large noise pulse at the output of the phase detector. In practice, the noise power at the input to the phase detector must be maintained at least 5 times smaller than the signal power in order to keep the probability that the sign will change smaller than 1e-6. In a well designed system, the modulation of the STO will be sufficient to ensure that the effects of Johnson noise and magnetic noise are negligibly small compared to phase noise in the STO, while not being so great as to allow noise to flip the signal polarity at the input to the phase detector.

Additionally, by increasing the anisotropy of the resonating free layer 312, one can expect an even bigger improvement in signal to noise ratio, due to the stiffer free layer 312, which will also reduce thermal fluctuations of the magnetization 330 greatly reducing magnoise. To further illustrate the performance advantage of the spin torque oscillator 302, assume a typical track of recorded bits in which T50=T, where T50 refers to the time required for the flux to rise from the 25% to 75% of it's full range and T refers to the time required to read or write a bit. Comparing a conventional GMR sensor reading a long magnet with the same sensor reading an embedded data bit to a spin torque oscillator reading the same two data sets, the mean square difference between the two read signals using the spin torque oscillator is about 4 times as great as the mean square difference between the read signals using the conventional GMR sensor.

One can estimate the signal to noise ratio expected from the spin torque oscillator 302 and compare it with a conventional GMR sensor. The signal to noise ratio of prior art GMR sensors has been in the range of about 27 to 33 dB. Sensor SNR requirements are likely to remain this high or even increase to 35 dB as recording enters the TB/in$^2$ regime. Signal to noise ratio in a magnetoresistive sensor is defined as SNR=10 Log$_{10}$(Signal$_{(0-p)}^2$/noise power), where Signal$_{(0-p)}$ is base-to-peak signal. With the spin torque oscillator sensor 302, the base-to-peak signal power is determined by the amount of frequency modulation one can expect from the maximum media field. The noise power is determined from the mean-squared fluctuation in the frequency.

Assuming the spectral line is Gaussian, then the FWHM is approximately 2.35 sigma and a 30 dB signal to noise ratio would roughly correspond to a line width to modulation depth ratio of about 13:1, while 40 dB would correspond to a ratio of 42:1. This would mean that to achieve 40 dB with modulation of plus or minus 5 GHz depth one would need a line width less than 234 MHz. With modulation of plus or minus 250 MHz, the line width would have to be less than 12 Mhz. There are two sources of phase noise contributing to spectral line width, both arising from thermal fluctuations: these are fluctuations along and perpendicular to the motion of the spin (velocity noise and angle noise). The velocity noise is given by $\Delta f_L=(4\pi\lambda\gamma\alpha k_B T n^2)/(M_s V D^2)$, where $\gamma$ is the gyromagnetic ratio, $\alpha$ is the Gilbert damping parameter, $K_B$ is Boltzmann's constant, $M_s$ is the magnetization, V is the volume, D is the degree of precession on the unit sphere, and n is the mode index. For typical materials at room temperature, this is about 24 MHz, much less than the line width required to achieve high SNR if the STO modulation depth is 5-10 GHz.

Angle noise is given by $\Delta f_t=n(df/d\theta)\Delta\theta$, where estimates of the value of df/d$\theta$ are approximately 35 MHz/degree for a typical material and device (J. Sankey et. Al, Phys. Rev B 72, 224427 (2005)). One can estimate the angle fluctuation from thermal excitation of a static spin system in a thermal bath. Such a very rough estimate of the expected change in precession angle thermal effects is presented here. The energy of the system can be estimated as $E(\theta)-K M_s V(\sin\theta)^2$, where $\theta$ is the angle at which the magnetization rotates from its equilibrium position, which is not exactly a fluctuation from the precession orbit, but close enough for this estimate, $M_s$ is the magnetization and K is the anisotropy. Putting this into an Arrhenius law expression and using $(\sin\theta)^2$ equal to $\theta^2$ for small angles, the probability of finding the magnetization at an angle $\theta$ away from its equilibrium is a Gaussian with a mean of 0 and a standard deviation of $[\mathrm{sqrt}(k_B T/2E_0)]$, where $E_0$ is the energy corresponding to the mean fluctuation angle $\theta_0$. Note that the energy barrier E0 is approximately $E(\pi/2)-KM_s V/2$.

For sensors of several different sizes, one can estimate the fluctuation angle corresponding to several energy barriers (expressed in eV or in anisotropy field):

| Size (nm) | E0(eV) energy barrier | Anisotropy Field (Oe) | Fluctuation angle (deg) | Frequency fluctuation (MHz) |
|---|---|---|---|---|
| 40 × 120 × 5 | 6.7 | 1000 | 2.5 | 87 |
| 40 × 120 × 5 | 13.4 | 2000 | 1.75 | 61 |
| 20 × 30 × 5 | 0.8 | 1000 | 7 | 245 |
| 20 × 30 × 5 | 1.7 | 2000 | 4.9 | 171 |

One can find that for sensors with sizes likely to be used at TB/in$^2$ or higher data densities, the likely frequency fluctuations would be about 200 MHz. By the considerations above, this angle noise contribution to the frequency noise will dominate. Based on this estimate, the overall system signal to noise ratio would be about 40 dB for a sensor with frequency modulation of 10 GHz. The frequency dependence of frequency angle df/d$\theta$ depends on the materials and shape of the sensor, so there is room to improve this term to further increase SNR or to reduce the frequency (and therefore current) at the operating point of the sensor.

By choosing a free layer with higher anisotropy, one can greatly reduce the magnetic noise (mag-noise) so that the velocity and angle noise of the precessing magnetization will dominate the noise. In particular, the noise power from the mag-noise is: $P_{magnoise} \approx k_B TPR_P(\Delta R/R)^2\alpha/H_{stiff}2\gamma M_s D^2 T_{free}$, where $k_B$ is Boltzmann's constant, T is temperature, P is the power dissipated by the sensor, $R_P$ is the sensor resistance, $\Delta R/R$ is the magnetoresistance, $\alpha$ is the Gilbert damping constant, $H_{stiff}$ is the stiffness field of the sensor (including uniaxial and shape anisotropies), $\gamma$ is the gyromagnetic ratio, $M_s$ is the saturation magnetization, D is one side of the sensor, and $t_{free}$ is the free layer thickness. Thus, a 3-fold increase in the anisotropy will result in a nearly 10-fold decrease in mag-noise.

Figure 7:
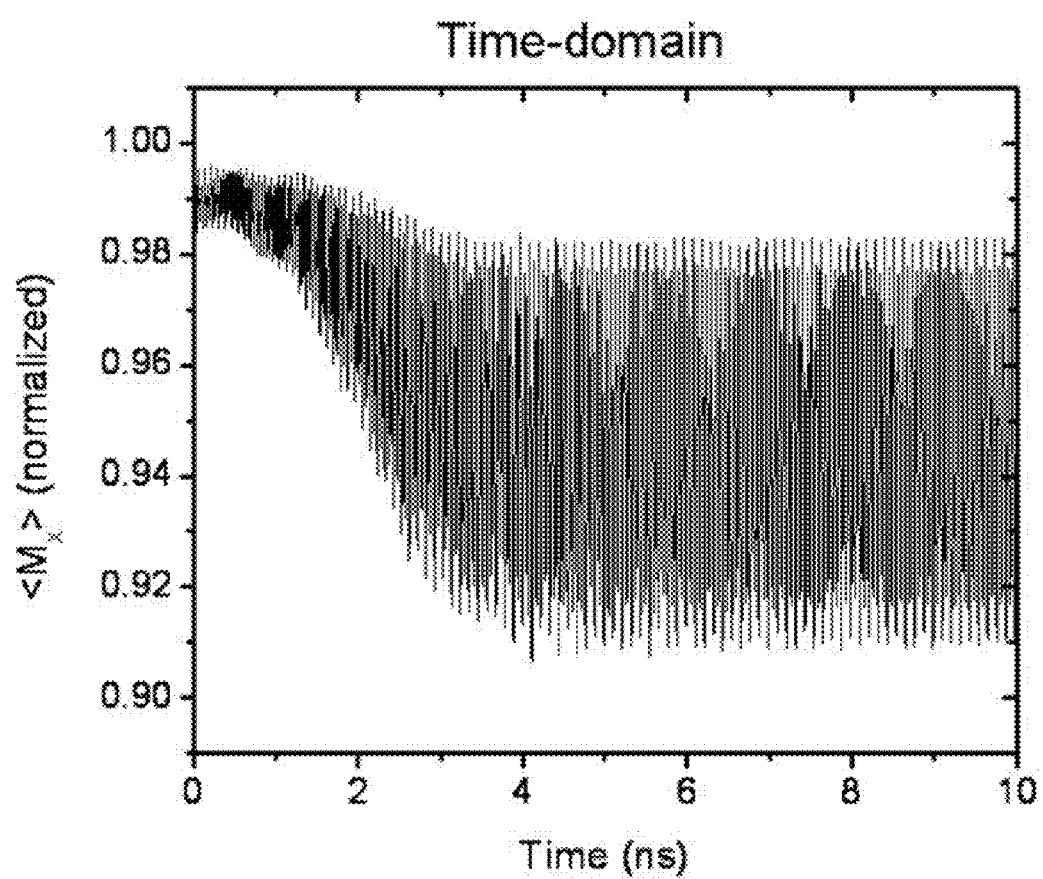
FIG. 7 is a simulated time domain graph of free layer magnetization vs. time for a typical spin valve structure with the application of a constant magnetic field.
Figure 8:
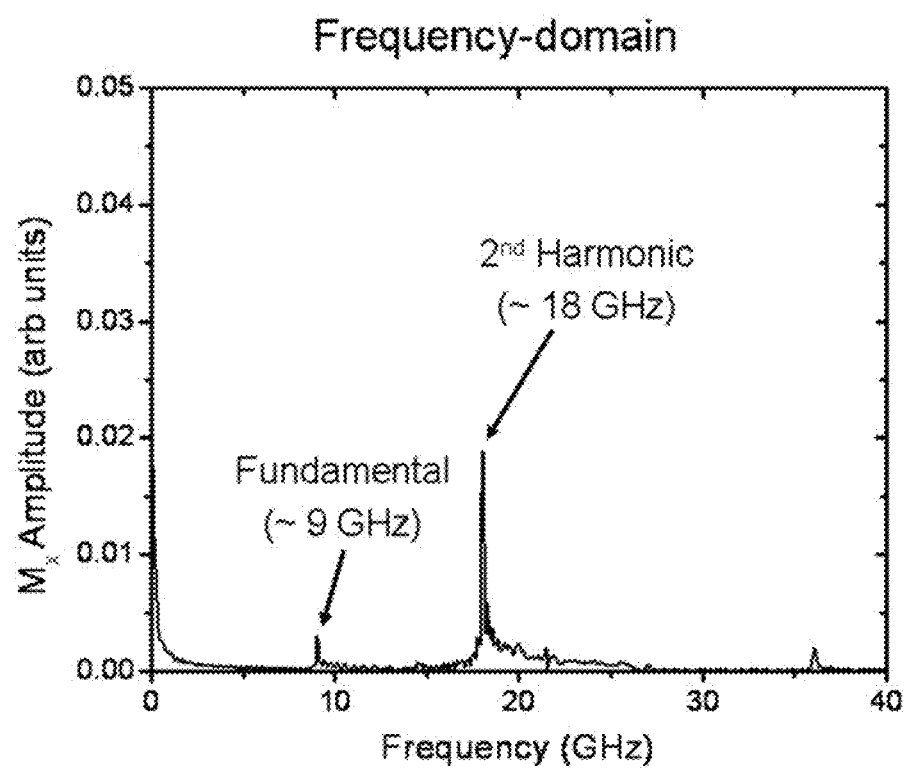
FIG. 8 is a frequency domain graph of free layer magnetization vs. time transformed from FIG. 7.

To illustrate aspects of the invention, one can consider several simple magnetic systems. FIGS. 7 and 8 illustrate how spin torque can excite steady state magnetization precession. The graphs of FIGS. 7 and 8 simulate a 40 nm by 120 nm by 5 nm thick elliptical nanomagnet under the influence of spin torque exerted by a spin polarized current with a current density of 5E7 A/cm$^2$ and a time-invariant 100 Oe magnetic field oriented along the long axis of the ellipse. After an initial brief period of time during which the magnetization oscillation amplitude (the graph of FIG. 7 plots the x component of magnetization) rings up, a steady state precession is reached which, when fast Fourier transformed, exhibits the clear spectral peaks at well defined frequencies shown in FIG. 8.

Figure 9:
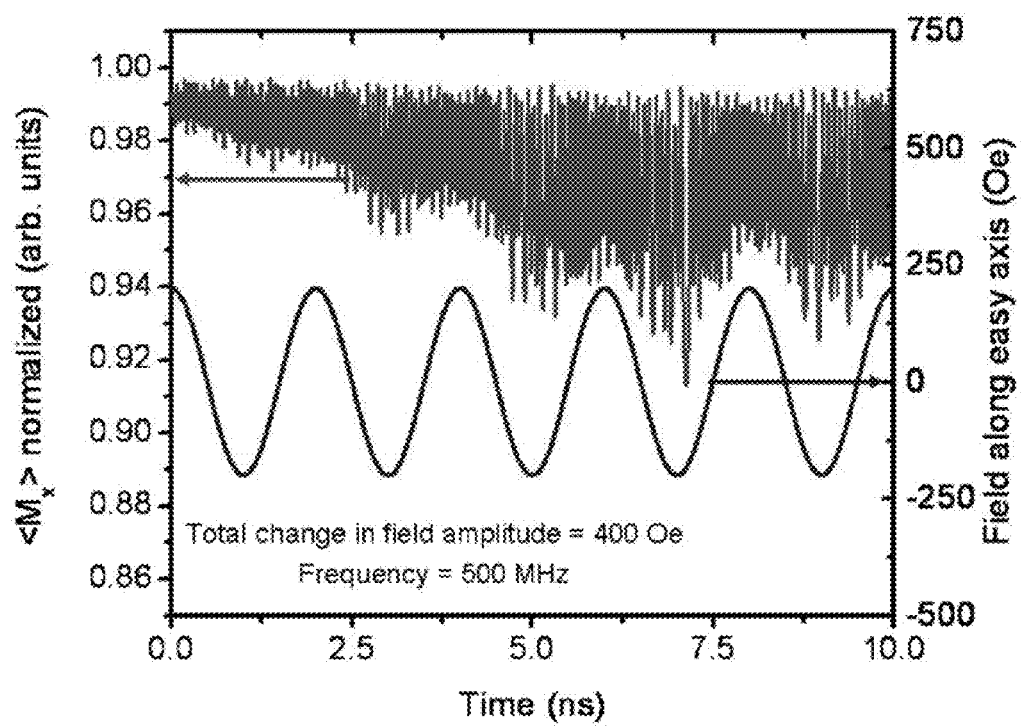
FIG. 9 is a graph showing the simulated response of the free layer magnetization oscillation to variations in external magnetic field amplitude for the same structure shown in FIGS. 7 and 8.

In the graph of FIG. 9, the DC field of the above example is replaced by an AC magnetic field (400 Oe peak-to-peak) to model the response of a spin torque oscillation sensor excited by hard drive media. Here, the precessing layer is assumed to have an anisotropy field of 1000 Oe. One can see that persistent magnetization oscillations can be generated for excitation fields typical of magnetic media. Furthermore, since the natural frequency of these oscillations (on the order of 10 GHzs or larger) are much higher than the 500 MHz AC field frequency, achieving a significant number of measurement cycles in one data period is not an issue.

Focusing on the times where the field is swept most positive or negative, one can see a distinct and measurable response to the excitation field, in both precession frequency and amplitude. By measuring the period in both of these regions, one can obtain a frequency shift in the spin torque oscillator of about 3.5 GHz between positive and negative peaks. Note that if detection is by GMR or TMR type sensor structures, whose resistance varies as the cosine of the angle between the magnetization of the precessing layer and the reference layer whose magnetization is fixed, then the signal frequency and frequency shifts are doubled with respect to the precession frequency.

Figure 5:
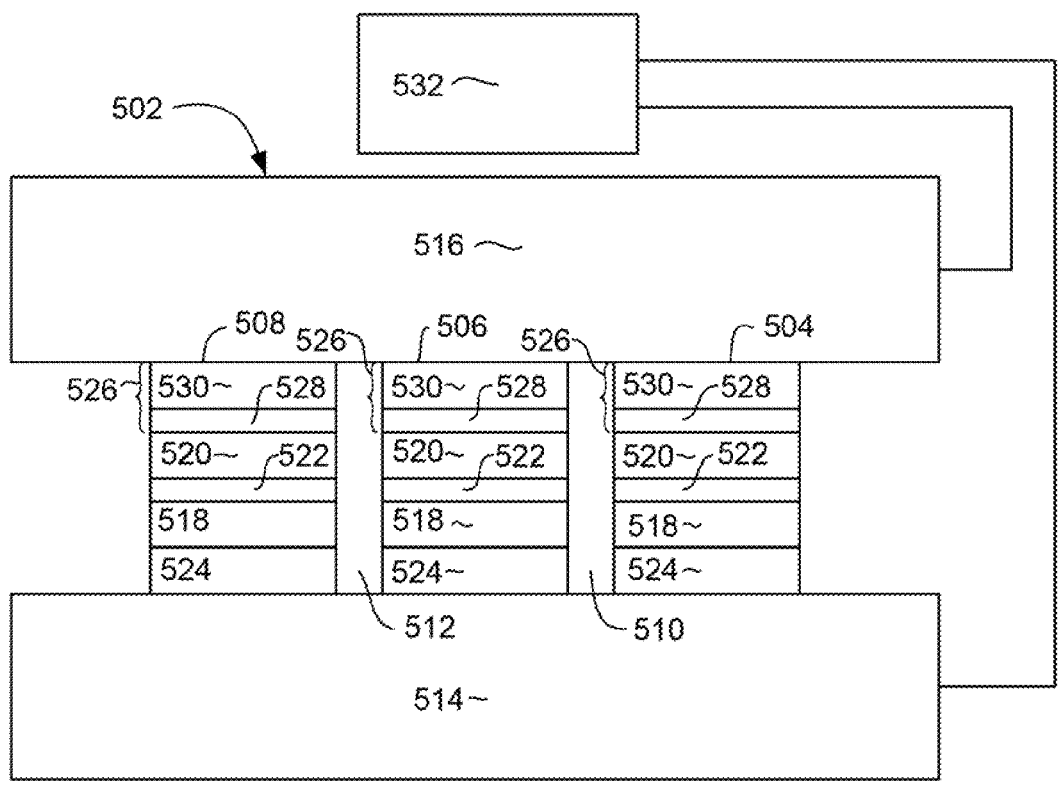
FIG. 5 is a schematic ABS view of a sensor design according to another possible embodiment of the invention.

FIGS. 4 and 5 show a magnetic configuration in which the magnetic sublayers of the antiparallel pinned reference layer are oriented substantially perpendicular to the free layer in the absence of a magnetic field and the external magnetic field to be sensed is substantially along the axis of the reference layer. Many other magnetic configurations in which sustainable oscillations with significant frequency shift with field are possible, including configurations in which the angle between the free layer and reference layer are not 90 degrees, and in which the magnetic field to be sensed is applied at an angle with respect to the reference and free layers. In particular, configurations in which the magnetization of all layers are co-linear in zero field and the field is applied either along the co-linear axis or perpendicular to it will also yield operable devices.

FIG. 5 illustrates another embodiment of the invention. Adjacent track interference poses a serious challenge to the reading of data tracks at very high data densities (e.g. at very small track widths). One way to address this challenge is to construct a multi-sensor, wherein a central sensor reads the desired track and first and second sensors at either side of the central sensor are used to read adjacent tack signals so that those signals can be cancelled out. However, in order for such a structure to be effective, the side sensors must be very close to the central primary sensor. If using a conventional sensor such as a GMR or TMR sensor, separate lead structures must be provided for each of the sensors. This makes the use of such a multi-sensor structure impractical in a functional read head. Lithographic patterning limitations limit the amount by which size and spacing of these leads can be reduced. In addition, the amount of available space (real estate) on a head is limited, such that the various leads for each of these sensors cannot fit onto the head.

The present invention, as illustrated with reference to FIG. 5 overcomes this challenge, making the use of a multi-sensor extremely practical. As shown in FIG. 5, a multilayer sensor structure 502 includes multiple sensor stacks 504, 506, 508. The sensor structure 502 is shown in FIG. 5 as viewed in a plane that is parallel with the air bearing surface (ABS). Therefore, the sensor structure 502 can include a central, primary sensor stack 506 that is used to read a desired data track. The structure 502 also includes first and second side sensors 504, 508 that can be used to sense adjacent data tracks. The sensor stacks 504, 506, 508 can be separated by narrow gaps 510, 512 that can be filled with a non-magnetic insulating material such as alumina. The sensor structure also includes first and second leads 514, 516 that can be constructed of an electrically conductive magnetic material so that they can function as magnetic shields as well as electrical leads.

Each of the sensor stacks 504, 506, 508 can be constructed in various manners to each form a magnetoresistive sensor unit. By way of example, each sensor stack 504, 506, 508 can include a reference or pinned layer 518, a magnetic free layer 520, and a non-magnetic spacer or barrier layer 522 sandwiched between the reference layer 518 and free layer 520. A layer of antiferromagnetic material (AFM layer) 524 can be provided adjacent to the pinned layer structure 518 to pin the magnetic moment of the pinned layer 518. An in stack bias structure 526 can be included adjacent to the free layer 520 to provide magnetic biasing to bias the magnetization of the free layer. The bias structure 526 can include a hard magnetic layer 528 and a non-magnetic layer 530 sandwiched between the hard magnetic layer 528 and the free layer 520. The sensor elements 504, 506, 508 have been shown as having in stack bias structures 526 in order to minimize the space between the sensor elements, and to allow the space between the sensor elements 504, 506, 508 to be filled with an electrically insulating material. If the bias layers 332, 334 of FIG. 3 had been used, then the space to either side of the sensor stack would have been filled with this bias material, which would greatly increase the distance between the sensor elements 504, 506, 508. However, other bias structures are possible as well. It should be pointed out, that while the sensor elements 504, 506, 508 are shown slightly different from the sensor 302 of FIGS. 3 and 4, their function as spin torque sensors remains fundamentally the same.

As mentioned above, prior art sensor structures required separate lead structures for each sensor stack, making multi-sensor structures practically impossible. The present invention, however, utilizes spin torque oscillation (as described above) to sense the presence of a magnetic field, thereby completely eliminating the need for separate lead structures.

As can be seen, each of the sensor stacks 504, 506, 508 shares a common bottom lead 514 and common upper lead 516. Therefore, the sensors 504, 506, 508 are connected in parallel with each other. Each sensor can be constructed so that it is tuned to a different natural harmonic oscillation frequency (in the absence of a magnetic field). This can be accomplished by adjusting the size, shape and or composition of the various layers of each sensor stack 504, 506, 508.

Because each sensor stack 504, 506, 508 has a different natural oscillation frequency, the signals from each sensor stack 532 can be processed by circuitry that can process the signals from each of the sensor stacks 504, 506, 508 from the common leads 514, 516. The circuitry can distinguish the signals from each of the sensor stacks 504, 506, 508 based on their different natural oscillation frequencies.

Figure 6:
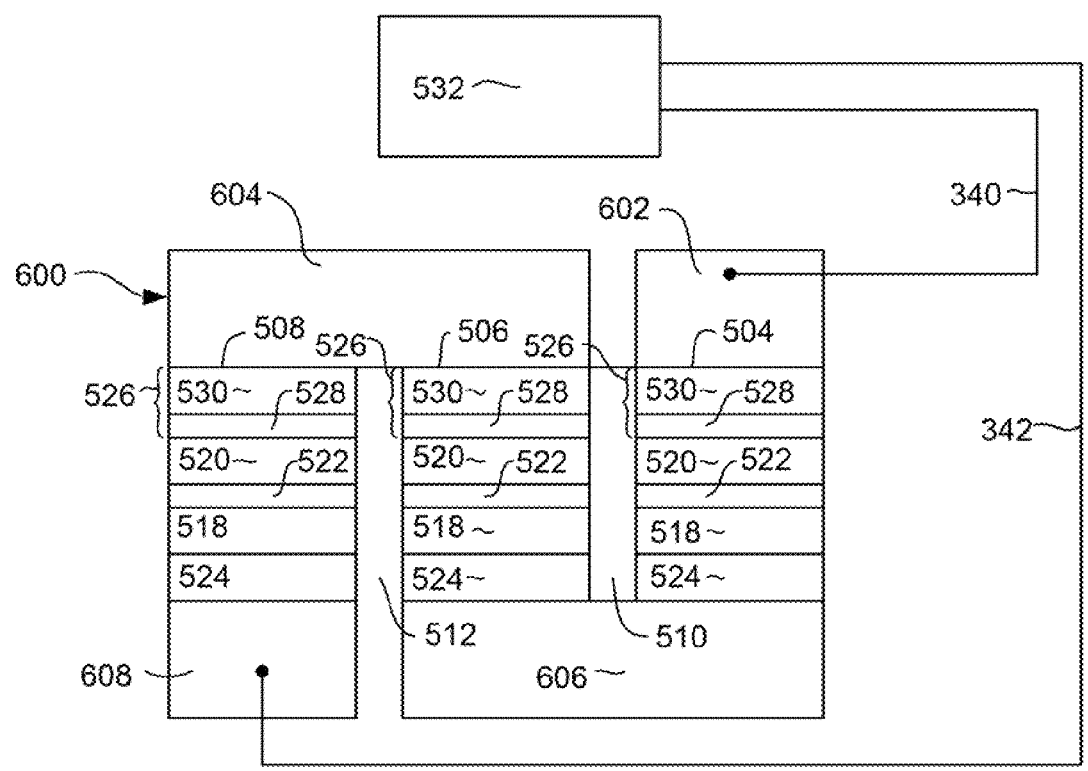
FIG. 6 is a schematic ABS view of a sensor design according to yet another possible embodiment of the invention.

FIG. 6 illustrates an embodiment of the invention wherein a plurality of sensor element can be connected in series electrically to mitigate adjacent track interference. The multi-sensor structure 600 includes multiple sensor stacks 504, 506, 508, which can be arranged side by side in a sensor array. The sensor stacks 504, 506, 508 can be arranged such that the central sensor 506 reads a desired data bit of interest and can be considered the primary sensor. The other sensor stacks 504, 508 can be arranged to read adjacent tracks.

One surface of one of the sensor elements (e.g. the top surface of sensor element 504) can be connected with a first lead/shield layer 602, which can be connected to processing circuitry 532 via lead 340. The other end of the sensor element 504 (e.g. the bottom end) can be connected with a lead/shield layer 606 that is also connected with an end of the middle sensor element 506. The other end of the middle sensor element 506 can be connected with a third lead/shield layer 604 that is also connected with an end of the sensor element 508. The other end of the sensor element 508 can then be connected with a lead/shield 608 that can be connected with processing circuitry 532 via lead layer 342. While other embodiments having other connection schemes are also possible, the above described embodiment illustrates how the invention can be used to connect side by side sensor elements in series to read adjacent tracks.

The sensor stacks 504, 506, 508 are connected in series via lead layers 602, 604, 606, 608 to processing circuitry 532 that can distinguish and process the signals from each of the sensor stacks 532. As with the above example, the sensor stacks 602, 604, 606 can be constructed so that each sensor stack has a unique natural spin torque oscillation frequency. In this way, the circuitry can distinguish the signal from each of the sensor stacks. The signal from the sensor stacks 504, 508 can be used to sense signals from adjacent tracks. The circuitry can then cancel out the signals from these adjacent tracks in order to eliminate adjacent track interference and isolate the signal from the desired track, read by the central sensor element 506.

It is also understood that this sensor can be incorporated as the detector in a scanning probe system for imaging the spatial distribution of magnetic fields, and also used as a sensor for the detection of magnetic structures combined with biological materials, as in an apparatus for counting magnetic beads tagged with biological molecules.

Spin Torque Oscillator Sensor Enhanced by Free Layer Magnetic Anisotropy:

Using spin torque oscillators as high frequency resonators and magnetic field sensors requires several important criteria to be met, such as high RF signal power, low noise (as indicated by the FWHM of the spectral peak), and in the case of a magnetic field sensor, large frequency changes with changes in magnetic field acting on the oscillating magnetic layer. Larger magnetization orbits provide the best combination of high signal power, low noise, and large frequency dispersions, yet phase noise, which is driven by thermal fluctuations acting upon the precessing moment, is still an issue for these orbit types, especially as the volume of the oscillating magnetic layer decreases because the overall magnetic energy $K_u V$ becomes closer to the thermal energy $k_B T$ (where $K_u$ is magnetic anisotropy, V is the volume of the oscillating layer, $k_B$ is the Boltzmann's constant and T is temperature). Using macrospin simulations, a particular magnetic configuration has been identified for spin valve or magnetic tunnel junction devices that produces a large angle clamshell orbit and additionally adds stability to the precessional orbit, thereby reducing the phase noise of the oscillator and limiting the dependence of the line-width on thermal effects and oscillator volume as observed in actual devices.

Figure 10:
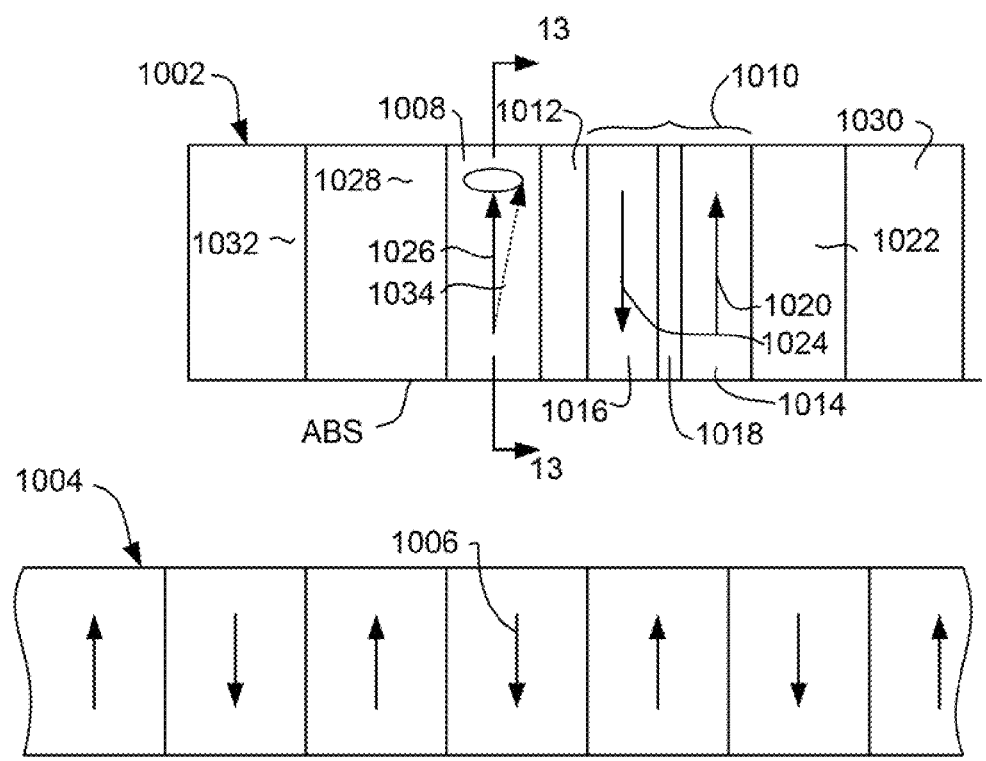
FIG. 10 is a cross sectional view of a spin torque sensor according to another embodiment of the invention.

FIGS. 10 through 13 illustrate sensor configurations that produce large angle orbits, which are preferable for the reasons discussed above. FIG. 10 shows a spin torque oscillator sensor 1002 relative to an adjacent perpendicular magnetic recording media 1004 having magnetizations 1006 that are oriented perpendicular to the surface of the media. The sensor 1002 can have an air bearing surface ABS that is oriented parallel with the surface of the media 1004, however, if the sensor 1002 is used in an application other than in a magnetic recording device, the sensor 1002 may not include such a ABS. The sensor 1002 includes a magnetic free layer 1008, a magnetic pinned layer structure 1010 and a non-magnetic layer 1012 sandwiched between the free layer 1008 and pinned layer structure 1010. The non-magnetic layer 1012 can be an electrically insulating barrier layer if the source of magnetoresistance of the sensor is based on the tunnel valve (TMR) effect, or can be an electrically conductive spacer layer if the sensor 1002 operates based on the giant magnetoresistive (GMR) effect.

The pinned layer structure 1010 can include a pinned magnetic layer 1014, a magnetic reference layer 1016 and a non-magnetic antiparallel coupling layer such as Ru 1018 sandwiched between the pinned and reference layers 1014, 1016. The pinned layer 1014 has a magnetization 1020 that is pinned in a direction parallel with the applied field 1006 as indicated by arrow symbol 1020 in FIG. 10. The magnetization 1020 can be pinned by exchange coupling with a layer of antiferromagnetic material (AFM layer) 1022, which can be a material such as IrMn or PtMn. Antiparallel coupling between the pinned layer 1014 and the reference layer 1016 pins the magnetization of the reference layer 1016 in a direction that is antiparallel with that of layer 1018 as indicated by arrow symbol 1024 in FIG. 10.

The free magnetic layer 1008 has its magnetization biased in a direction that is nearly anti-parallel with the magnetization 1024 of the reference layer 1016 as indicated by arrow symbol 1026, but which is at a slight angle relative to the magnetization 1016 of the reference layer. This can be seen with reference to FIG. 13, which shows an exploded schematic view of the reference layer 1016 and free layer 1008. As can be seen, the reference layer has a magnetization that is pinned in a direction that is parallel (or antiparallel) with the applied magnetic field 1006, but the free layer 1008 has a magnetization that is biased in a direction that is nearly anti-parallel with the direction of the reference layer magnetization 1024, but which is offset by an angle 1302 that is preferably about 20-60 degrees. In an extreme case the angle 1302 could be nearly 90 degrees. Biasing of the free layer can be provided by hard magnetic bias layers that are not shown in FIG. 10, but would be into and out of the page in FIG. 10. While the free layer is magnetically biased, the magnetization of the free layer is free to move in a precessional spin torque oscillation as indicated by arrow symbol and as discussed previously.

With reference again to FIG. 10, canting of the free layer magnetization 1026 with respect to the magnetization direction of the reference layer can be provided by a magnetic anisotropy having a component oriented perpendicular to the direction of magnetization 1024 of the reference layer, and/or perpendicular to a direction of an applied magnetic field 1006. This magnetic anisotropy, which will be discussed in greater detail herein below can be produced by a layer of antiferromagnetic material that is weakly exchange coupled with the free layer 1008, or by shape anisotropy, or by a texture induced magnetic anisotropy. The canting of the free layer can also be achieved by placement of high coercivity magnetic material near the free layer and with magnetization having a substantial component perpendicular to the reference layer, in analogy to hard bias structures used in recording heads to stabilize the free layer of GMR and TMR readback sensors. These are by way of example, however, as other mechanisms could be used as well.

In addition, first and second electrically conductive magnetic shields 1030, 1032 can be provided at either end of the sensor 1002. These can be constructed of a material such as NiFe and function as electrodes as well as magnetic shields, as may be done to define resolution in a magnetic recording sensor. In some applications the electrodes need not be magnetic.

Figure 11:
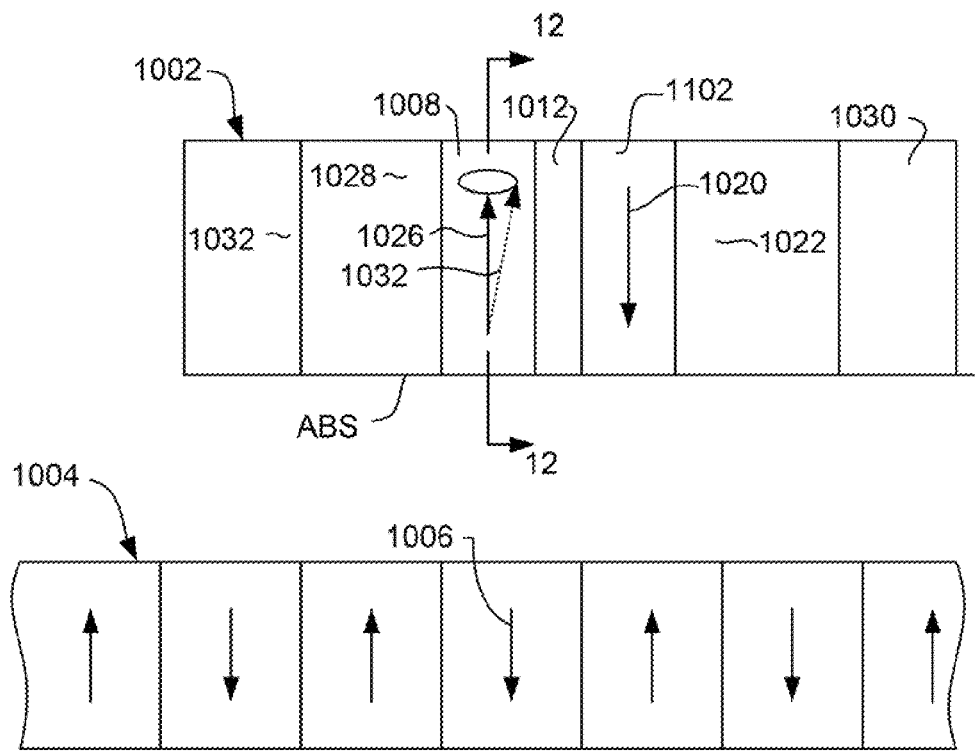
FIG. 11 is a cross sectional view of a spin torque sensor according to yet another embodiment of the invention.

FIG. 11 shows an embodiment that is similar to that of FIG. 10, except that it uses a simple pinned layer 1102 that acts as a reference layer. The simple pinned layer 1102 includes a single magnetic layer that is exchange coupled with the AFM layer 1022. Dipolar field interactions between free and reference layers could provide biasing for the oscillating free layer, allowing the STO to function in zero applied field and therefore not require hard bias along the reference layer direction or other such in-stack layers. This embodiment also provides a simplified design with a smaller gap spacing (i.e. space between the shields 1030, 1002). As with the previously described embodiment, the pinned layer 1020 has its magnetization oriented parallel with the applied magnetic field 1006 and the free layer has its magnetization 1026 oriented nearly antiparallel with 1020, but offset by a small angle 1302 as discussed with reference to FIG. 13.

Figure 12:
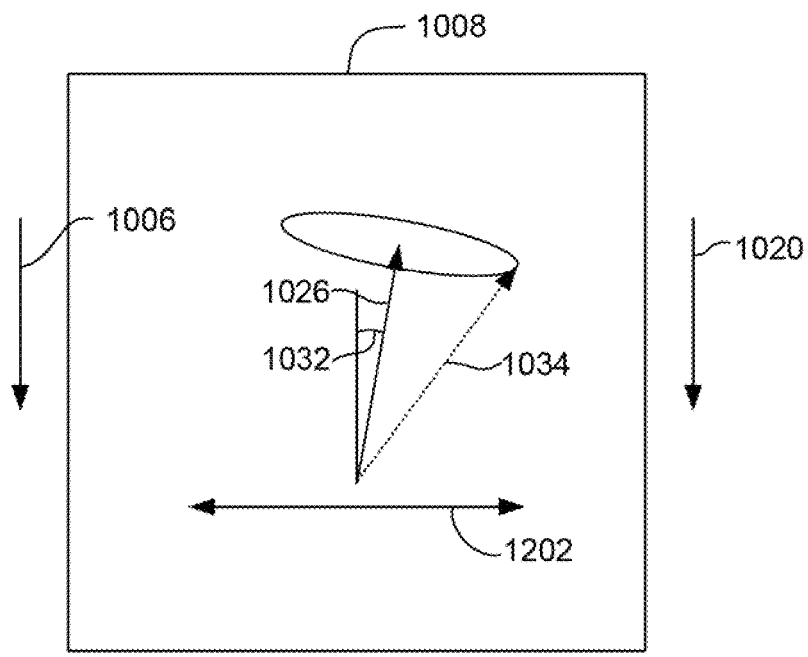
FIG. 12 is a view of a free layer of the spin torque oscillator of either FIG. 10 or FIG. 11.
Figure 13:
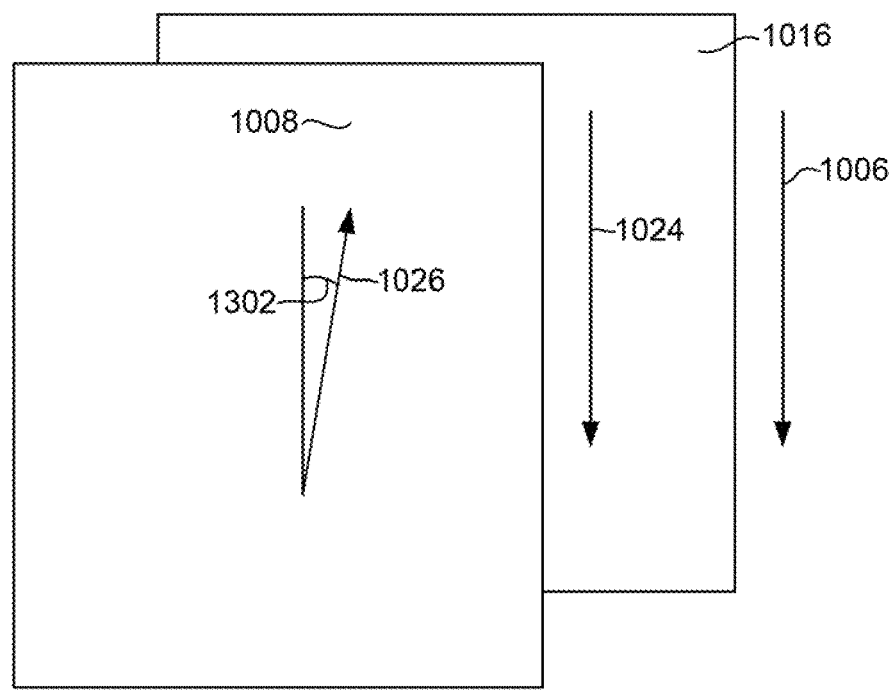
FIG. 13 is an exploded view of a free layer and a reference layer of a spin torque sensor.

FIG. 12 shows a cross sectional view of the free layer 1008 as seen from line 11-11 of FIG. 10. As can be seen, the free layer 1008 has a small magnetic anisotropy 1202 that is oriented perpendicular to the direction of the applied magnetic field 1006. This magnetic anisotropy 1102 has been found to improve sensor performance by lowering signal noise such as phase noise in the signal.

This magnetic anisotropy 1202 can be provided by one or more of several mechanisms. For example, the free layer 1008 can be formed to have a shape that results in a shape induced magnetic anisotropy. Another way could be to weakly exchange couple the free layer to an antiferromagnet 1028 (FIGS. 10 and 11) in a direction canted slightly away from the reference layer. This method has the dual benefit of providing anisotropy and producing more macrospin-like magnetization oscillations. The magnetic anisotropy 1102 could also come as a result of magnetostriction of the material in combination with mechanical stresses in the free layer. This magnetostriction can be engineered into the free layer 1008 by constructing the free layer of material that will possess the desired magnetostriction to result in the desired anisotropy 1102. Such materials could include for example, Ni alloys or CoFe and its alloys having sufficiently high magnetostriction that in the stress environment of the free layer an effective anisotropy with component perpendicular to the reference layer of >10 Oe is achieved. Another way to induce to a desired magnetic anisotropy 1102 is to deposit the free layer 1008 on a surface that has been treated with a desired texture. For example, if the free layer 1008 is deposited after the barrier/spacer layer 1012, then the interface between the layer 1012 and the layer 1008 would be treated with an anisotropic texture that is designed to induce the magnetic anisotropy 1102 (FIG. 11) in the free layer 1008. On the other hand, if the layers were deposited in the opposite order such that the free layer is deposited over the layer 1028, then the interface between layers 1028 and 1008 could be treated with such an anisotropic texture. This magnetic anisotropy can also be produced by forming the free layer 1008 itself with such an anisotropic texture. The treatment of surfaces in order to produce such a desired magnetic anisotropy is discussed in commonly assigned U.S. Pat. Nos. 7,382,573, 7,436,634 and 7,466,515 which are incorporated herein by reference.

The canting of the free layer magnetization 1026 (at angle 1302) is the result of biasing the free layer 1008 in a direction that is antiparallel with the direction of reference layer magnetization 1020 (FIG. 11) in combination with magnetic anisotropy 1202 that cants the free layer magnetization by between 5 and 85 degrees, and is typically resulting in an effective field component between 50 and 500 Oe. While the anisotropy 1202 is shown as being perpendicular to the direction of the reference layer magnetization 1020 and perpendicular to the applied field direction 1006, the anisotropy could be at some other angle, having a component that is perpendicular to these directions 1006, 1020.

Figure 14:
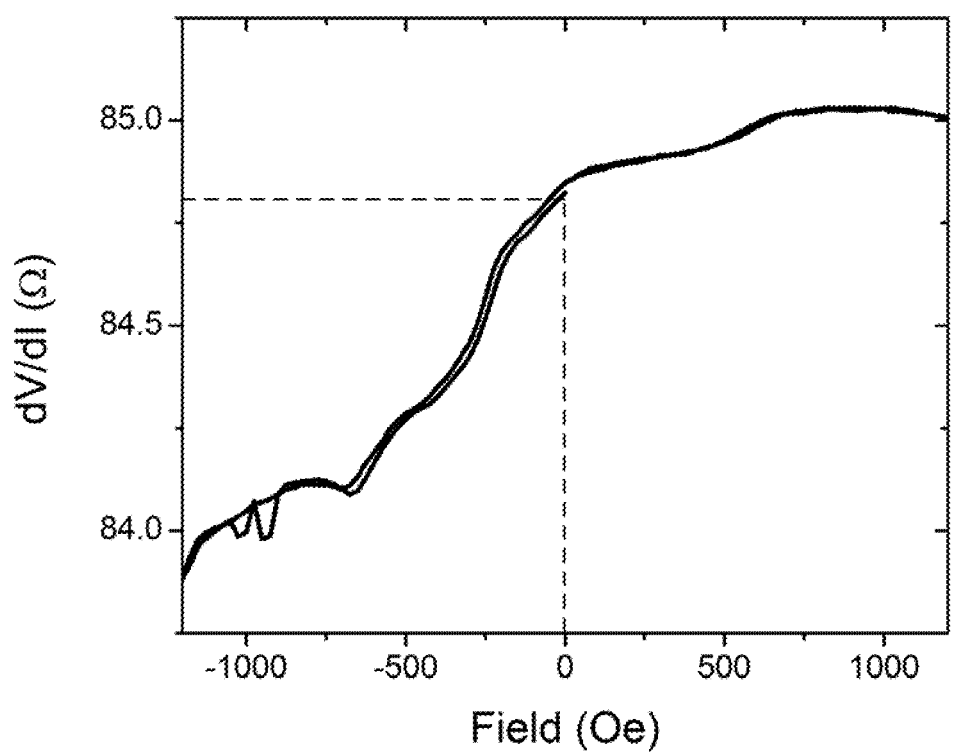
FIG. 14 is a graph of a transfer curve of a spin torque oscillator.
Figure 15:
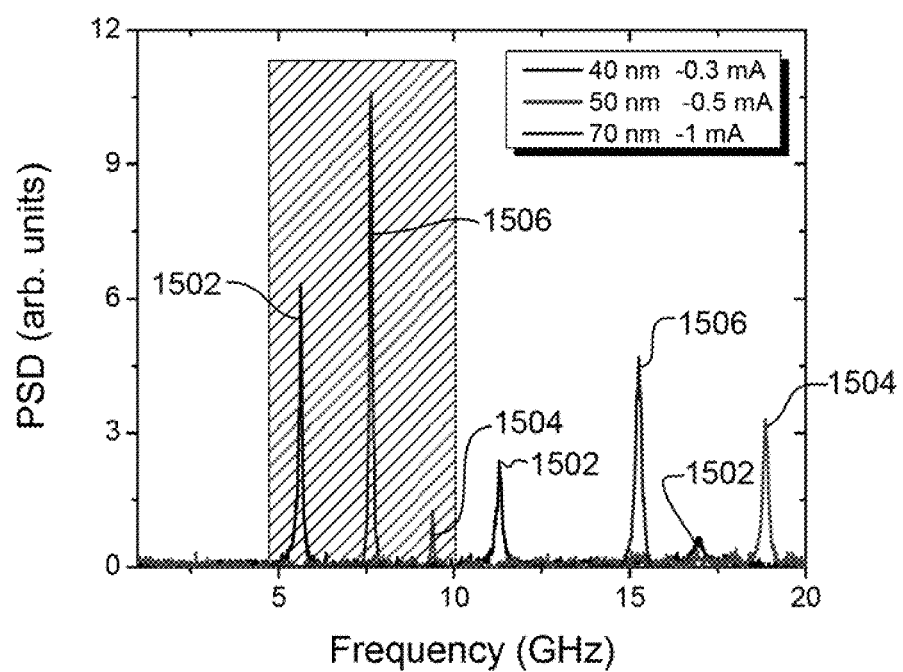
FIG. 15 is a graph showing signal harmonics for sensors of various sizes.

The transfer curve for such a spin torque oscillator 1002 is shown in FIG. 14, which shows a misalignment between the free and reference layer magnetizations 1026, 1020, indicated by an intermediate resistance state at zero applied magnetic field, driven by a small amount of magnetic anisotropy 1202 in the free layer 1008 oriented at a large angle away from the free layer moment. This misalignment is further shown in FIG. 15 when measuring DC current driven oscillations using a spectrum analyzer, where both first and second harmonics are present in the spectra, the sizable presence of the first harmonic denoting a misalignment of the precession axis with the reference layer. FIG. 15 shows spectra for sensors of various sizes (40 nm, 50 nm and 70 nm). Line 1502 represents a spin torque oscillator with a diameter of 40 nm, line 1504 for 50 nm and 1506 for 70 nm. Comparing spectra from spin torque oscillators with diameters of 40, 50 and 70 nm one can see that there is not a significant difference between first or second harmonic line-widths, indicating that linewidth broadening due to temperature fluctuations are strongly attenuated due to the presence of a component of magnetic anisotropy perpendicular to the applied field direction (same as the reference layer direction) in these devices. First harmonic line-widths on the order of 100 MHz, and values down to 10 MHz during room temperature operation have been observed in 40 nm diameter spin torque oscillators with this magnetization and anisotropy configuration.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A spin torque oscillation device, comprising:
   a magnetic reference layer having a magnetization that is pinned in a first direction;
   a magnetic free layer a magnetic anisotropy with a component that is perpendicular to the first direction; and
   a non-magnetic layer sandwiched between the magnetic free layer and the magnetic reference layer;
   wherein the magnetic free layer has a magnetization that oscillates as a result of a spin torque arising from a current flow through the magnetic reference layer, non-magnetic layer and magnetic free layer and
   wherein the magnetic free layer has a magnetization that is biased in a direction that is substantially antiparallel with the first direction, but which is canted away from an antiparallel orientation with respect to the reference layer as a result of the magnetic anisotropy of the free layer.

2. The spin torque device as in claim 1 wherein the oscillation has a frequency that varies in response to the presence of a magnetic field.

3. The spin torque device as in claim 1 wherein the magnetization of the free layer is canted at an angle of 5-85 degrees.

4. The spin torque device as in claim 1 wherein the magnetic anisotropy component perpendicular to the first direction has a strength of 50-500 Oe.

5. The spin torque device as in claim 1 wherein the magnetic anisotropy is at least in part the result of an anisotropic texture.

6. The spin torque device as in claim 1 wherein the magnetic anisotropy is at least in part the result of shape anisotropy.

7. The spin torque device as in claim 1 wherein the magnetic anisotropy is at least in part the result of a magnetostriction induced magnetic anisotropy.

8. The spin torque device as in claim 1 wherein the magnetic anisotropy is at least in part the result of a weak exchange coupling to an antiferromagnetic layer.

9. The spin torque device as in claim 1 wherein the canting of the free layer magnetization is at least in part due to a field arising from hard bias.

10. The spin torque device as in claim 1 wherein the oscillation is in the form of a precession about an axis.

11. The spin torque device as in claim 1 wherein the spin torque oscillation device is a read back sensor for use in a magnetic data recording system.

12. A spin torque oscillation device, comprising:
a magnetic reference layer having a magnetization that is pinned in a first direction;
a magnetic free layer having a magnetic anisotropy with a component that is perpendicular to a direction of an applied magnetic field; and
a non-magnetic layer sandwiched between the magnetic free layer and the magnetic reference layer;
wherein the magnetic free layer has a magnetization that oscillates as a result of a spin torque arising from a current flow through the magnetic reference layer, non-magnetic layer and magnetic free layer and
wherein the magnetic free layer has a magnetization that is biased in a direction that is substantially antiparallel with the first direction, but which is canted away from an antiparallel orientation with respect to the reference layer as a result of the magnetic anisotropy of the free layer.

13. The spin torque device as in claim 12 wherein the oscillation has a frequency that varies in response to the presence of a magnetic field.

14. The spin torque device as in claim 12 wherein the magnetic free layer has a magnetization that is biased at an angle relative to a direction of a magnetic field to be detected.

15. The spin torque device as in claim 12 wherein the magnetic free layer has a magnetization that is biased at an angle of 5-85 degrees relative to the applied magnetic field, wherein the angle is the result of the magnetic anisotropy.

16. The spin torque device as in claim 12 further comprising a biasing structure that biases the magnetization of the free layer in a direction that is antiparallel with the first direction, and wherein the magnetic anisotropy causes the magnetization of the free layer to be canted at an angle of 5-85 degrees relative to the antiparallel direction.

17. The spin torque device as in claim 12 wherein the magnetic anisotropy component perpendicular to the first direction has a strength of 50-500 Oe.

18. The spin torque device as in claim 12 wherein the magnetic anisotropy is at least in part the result of an anisotropic texture.

19. The spin torque device as in claim 12 wherein the magnetic anisotropy is at least in part the result of shape anisotropy.

20. The spin torque device as in claim 12 wherein the magnetic anisotropy is at least in part the result of a magnetotriction induced magnetic anisotropy.

21. The spin torque device as in claim 12 wherein the magnetic anisotropy is at least in part the result of a weak exchange coupling to an antiferromagnetic layer.

22. The spin torque device as in claim 12 wherein the oscillation is in the form of a precession about an axis.

23. The spin torque device as in claim 12 wherein the oscillation is in the form of a precession about an axis that is canted at an angle of 5-85 degrees relative to a direction that is antiparallel with the first direction.

24. The spin torque device as in claim 12 wherein the spin torque device is a magnetoresistive sensor for use in a magnetic data recording system.

* * * * *